(12) United States Patent
Parkin

(10) Patent No.: US 7,551,469 B1
(45) Date of Patent: Jun. 23, 2009

(54) UNIDIRECTIONAL RACETRACK MEMORY DEVICE

(75) Inventor: Stuart Stephen Papworth Parkin, San Jose, CA (US)

(73) Assignee: Internationa Business Machines Corporation, Armonk, NY (US)

( * ) Notice: Subject to any disclaimer, the term of this patent is extended or adjusted under 35 U.S.C. 154(b) by 0 days.

(21) Appl. No.: 12/348,779

(22) Filed: Jan. 5, 2009

(51) Int. Cl.
*G11C 19/00* (2006.01)
(52) U.S. Cl. .................. 365/80; 365/158; 365/171; 977/933
(58) Field of Classification Search .............. 365/80, 365/83, 85, 148, 158, 171, 173; 257/421, 257/E21.665; 438/3; 977/933–935
See application file for complete search history.

(56) References Cited

U.S. PATENT DOCUMENTS

| | | | |
|---|---|---|---|
| 3,916,395 A | 10/1975 | Urai | |
| 4,974,200 A | 11/1990 | Ono et al. | |
| 5,103,329 A | 4/1992 | Clark et al. | |
| 6,834,005 B1 | 12/2004 | Parkin | |
| 7,031,178 B2 * | 4/2006 | Parkin | 365/80 |
| 7,236,386 B2 * | 6/2007 | Parkin | 365/80 |
| 2007/0047156 A1 | 3/2007 | Cowburn et al. | |

OTHER PUBLICATIONS

Smith, "A Magnetic Shift Register Employing Controlled Domain Wall Motion," IEEE Transactions on Magnetics, Dec. 1965, pp. 281-284, vol. 1, No. 4, IEEE, USA.

Parkin et al., "Magnetic Domain-Wall Racetrack Memory," Science, Apr. 2008, vol. 320, American Association for the Advancement of Science, Washington DC, USA.
Supporting Online Material for: Parkin et al., "Magnetic Domain-Wall Racetrack Memory," Science, Apr. 2008, vol. 320, American Association for the Advancement of Science, Washington DC, USA.
Hayashi et al., "Current-Controlled Magnetic Domain-Wall Nanowire Shift Register," Science, Apr. 2008, pp. 209-211, vol. 320, American Association for the Advancement of Science, Washington DC, USA.
Supporting Online Material for: Hayashi et al., "Current-Controlled Magnetic Domain-Wall Nanowire Shift Register," Science, Apr. 2008, pp. 209-211, vol. 320, American Association for the Advancement of Science, Washington DC, USA.

* cited by examiner

*Primary Examiner*—Son Dinh
*Assistant Examiner*—Harry W Byrne
(74) *Attorney, Agent, or Firm*—Daniel E. Johnson

(57) ABSTRACT

A racetrack memory storage device moves domain walls along the racetrack in one direction only. The reading element can be positioned at one end of the racetrack (rather than in the middle of the racetrack). The domain walls are annihilated upon moving them across the reading element but their corresponding information is read into one or more memory devices (e.g., built-in CMOS circuits). The information can then be processed in circuits for computational needs and written back into the racetrack either in its original form (as it was read out of the racetrack) or in a different form after some computation, using a writing element positioned at the end of the racetrack opposite to the reading element. Such a racetrack can be built more simply and has greater reliability of operation than previous racetrack memory devices.

18 Claims, 5 Drawing Sheets

UNIDIRECTIONAL RACETRACK MEMORY DEVICE

This invention was made with Government support under Contract No. H94003-06-2-0604 awarded by the U.S. Department of Defense. The Government has certain rights in the invention.

TECHNICAL FIELD

The present invention relates to memory storage systems, and particularly to a memory storage system that uses current to move magnetic domain walls across read and write devices, allowing data to be stored in, and read out of, domains or domain walls in a magnetic racetrack.

BACKGROUND

A racetrack memory device stores information in the form of magnetic domain walls in magnetic nanowires or "racetracks". The domain walls are moved backward and forward along the nanowires using short (~nanosecond long) current pulses, in which the electrons carrying the current are spin polarized. The spin polarized current carries spin angular momentum, which is transferred to the domain walls causing them to move in the direction of the electron flow. For example, a series of domain walls, representing zeros and ones, may be moved to and fro along the racetrack past a reading device and a writing device, which are positioned in the middle of the racetrack. In the prior art, a reservoir is maintained in the racetrack, so that a series of domain walls can be moved across the reading and writing devices. This then allows the reading of any domain wall or the writing of a new domain wall or domain walls somewhere within the train of existing domain walls, without otherwise damaging or upsetting the series of domain walls. When only one reading and writing device is used per racetrack, the reservoir would generally need to be at least as long as the train of stored domain walls.

Thus, the prior-art racetrack memory technology favors long racetracks. To move the domain walls along the racetrack, a certain current density is required for a certain length of time. The faster the domain walls are moved, the greater the current density that is needed. However, the higher the current density is, the higher the magnitude of voltage along the racetrack that is required. The longer the racetrack, the higher is the resistance of the racetrack and the higher is the required voltage for the same magnitude of current density.

In addition, prior-art racetrack memory devices employ bi-directional motion of domain walls along the magnetic racetracks, so that domain walls can be moved in either direction across the reading and writing devices. For this purpose, electronic circuits deliver current pulses of either positive or negative polarity along the racetracks. Such racetracks are preferably designed so that the domain walls can be moved reliably in either direction along the racetrack.

SUMMARY

One embodiment of the invention is directed to a device that includes a track that includes magnetic material, in which the track is designed to contain magnetic regions that can be shifted along the track in response to electric current passing through the track. These magnetic regions include respective domain walls. The device further includes a read component for reading out data represented by respective magnetic regions in the track, in which the domain walls of the respective magnetic regions are annihilated upon reading out the data represented by the respective magnetic regions. The device further includes a write component for writing data into magnetic regions in the track after corresponding data are read out by the read component, so that the device functions as a shift register. The read component and the write component may be advantageously located at opposite ends of the track. In a preferred implementation, the magnetic regions can only be moved in one direction through the track. Also, the data represented by the respective magnetic regions may be advantageously written into a memory device, before the data are written back into magnetic regions by the write component.

One aspect of the invention is a method that includes applying a current pulse to the track of the device, so that a given magnetic region is moved from one pinning site in the track to another pinning site in the track. The method may further include reading information into a memory device (e.g., a CMOS device), in which the information corresponding to the data is represented by the respective magnetic regions; this information can then be written back into magnetic regions in the track by the write component. Alternatively, the method may further include performing calculations with the information stored in the memory device, thereby constructing or forming different information, which can then in turn be written into magnetic regions in the track by the write component.

Another embodiment of the invention is a device that includes a track that includes magnetic material, in which the track contains magnetic regions that represent data. These magnetic regions include respective domain walls, which are shifted along the track in only one direction by electric current applied to the track. The device also includes a read component for reading out data represented by respective magnetic regions in the track, in which the domain walls of the respective magnetic regions are annihilated upon reading out the data represented by the respective magnetic regions. The device further includes a write component for writing data into magnetic regions in the track after corresponding data are read out by the read component, so that the device functions as a shift register. The track itself may be advantageously shaped to promote movement of the domain walls in only one direction. For example, the track may have a cross sectional area that decreases monotonically along the track. Also, the track may include segments that are contoured so that the magnetic regions only move in one direction through the track.

BRIEF DESCRIPTION OF THE DRAWINGS

FIG. 2, which includes

FIG. 3, which includes FIG. 4, which includes

DETAILED DESCRIPTION

Figure 1:
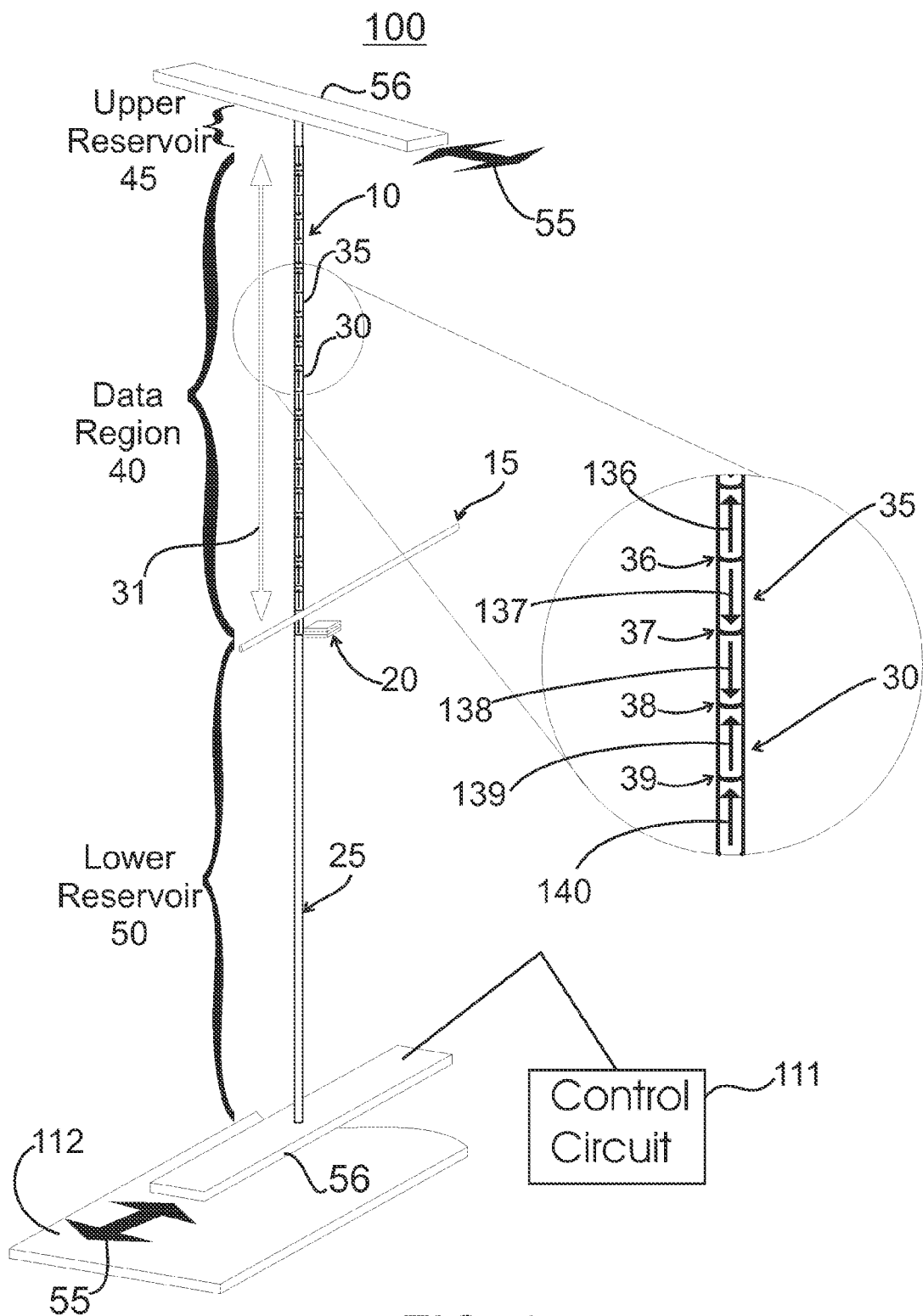
FIG. 1 illustrates various features of a magnetic racetrack device.

FIG. 1 illustrates an exemplary magnetic memory system 100 comprising a magnetic shift register 10 that utilizes a writing element 15 and a reading element 20. Both the reading element 20 and the writing element 15 form a read/write element of system 100. The magnetic shift register 10 comprises a data column 25 comprised of a fine wire (or track) preferably made of ferrimagnetic or ferromagnetic material. The data column 25 can be magnetized in small sections, or domains, in one direction or another, using the writing element 15.

The order parameter of the magnetic material from which the track is fabricated, that is, the magnetization direction or the direction of the magnetic moment, can in general change from one direction to another between domains. This variation in the direction of the magnetic moment forms the basis for storing information in the data column 25. Depending on the desired coding scheme of the shift register 10, data can be stored in 1) magnetized regions of the shift register 10, such as the magnetic domains, e.g., 30, 35; 2) the domain walls, e.g., 36, 37, 38, 39 that separate the domains; or 3) both the magnetic domains, e.g., 30, 35, and the domain walls, e.g., 36, 37, 38, 39. As used herein, the domains walls, e.g., 36, 37, 38, 39, are transition magnetized regions between the magnetic domains, e.g., 30, 35. Possible magnetization directions of the domains are indicated in FIG. 1 by the arrows 136, 137, 138, 139, 140.

At any given time during its operation, the magnetic shift register 10 is comprised of a data region 40, an upper reservoir 45, and a lower reservoir 50. The data region 40 comprises a contiguous set of domains, such as domains 30, 35 that store data. Additional length is provided to the magnetic shift register 10 in the form of the upper reservoir 45 and the lower reservoir 50.

The combined length of the upper reservoir 45 and the lower reservoir 50 is preferably sufficiently long that it can accommodate all the domains in the data region 40 when these domains are moved completely from data region 40 across the writing element 15 and reading element 20 for the purposes of writing and reading domains in the data region 40, respectively. At any given time, the domains are thus stored partially in data region 40 and partially in the upper reservoir 45 or the lower reservoir 50. Consequently, it is the combination of data region 40, the upper reservoir 45, and the lower reservoir 50 that forms a complete storage element. For example, the upper reservoir 45 may be devoid of magnetic domains in a quiescent state. In another embodiment, however, the lower reservoir 50 may be devoid of magnetic domains in a quiescent state. Also, the data column 25 may comprise a data region 40 and two or more reservoirs 45, 50, or alternatively, the magnetic shift register 10 may include a single reservoir 45 or 50.

The various regions 40, 45, 50 of the shift register 10 are contiguous and may be identical in structure and composition. The data region 40 is not a fixed region of the column 25, but rather the data region 40 will be shifted up and down the column during the operation of the storage device for the purposes of reading and writing data to and from the column 25. Thus, the data region 40 at any given time can be located within a different portion of the magnetic shift register 10. Although the data region 40 can be one contiguous region, the spatial distribution and extent of the domains within the data region 40 can be approximately the same no matter where the data region 40 resides within the magnetic shift register 10. In another embodiment, the spatial extent of the storage region can be increased during the motion of this region particularly across the reading element 20 and writing element 15. A portion of or even the entire data region 40 can be moved into the upper reservoir 45 or the lower reservoir 50 to access data in specific domains.

Together, the upper reservoir 45 and the lower reservoir 50 of FIG. 1 preferably have approximately the same size as, or are slightly longer than, the data region 40. However, other alternative embodiments can allow the upper reservoir 45 or the lower reservoir 50 to have different sizes relative to the size of the data region 40. As an example, the combined length of the upper reservoir 45 and the lower reservoir 50 can be much smaller than the data region 40 if more than one reading element 20 and writing element 15 are used for each magnetic shift register 10. For example, if two reading elements 20 and two writing elements 15 are used for one magnetic shift register 10 and are disposed equidistally along the length of the data region 40, then the upper reservoir 45 and the lower reservoir 50 together require a length that is only approximately half as long as the data region 40.

A current 55 controlled by a control circuit 111 (overlying a base 112) is applied to the data column 25, via electrical contacts 56, to move the magnetic moments within domains 30, 35, along the data column 25, and past the reading element 20 or the writing element 15. In a magnetic material with domain walls, a current passed across the domain walls moves the domain walls in the direction of the current flow. As the current passes through a domain, it becomes "spin polarized". When this spin-polarized current passes through into the next domain across the intervening domain wall, it develops a spin torque. This spin torque is what moves the domain wall. Domain wall velocities can be very high, e.g., on the order of 100 to several hundred m/sec, so that the process of moving a particular domain to the required position for the purposes of reading this domain or for changing its magnetic state by means of the writing element can be very short.

Preferred embodiments of the present invention, as now described with respect to FIGS. 2, 3, and 4, enable shorter racetracks for the same number of domain wall bits. It provides a racetrack for which the domain walls only need to be moved in one direction along the racetrack, thereby enabling racetrack structures having more reliable motion of the domain walls, since the domain walls can only move in one direction. To this end, domain walls are destroyed upon being read out, and are then rewritten into the racetrack.

Figure 2A:
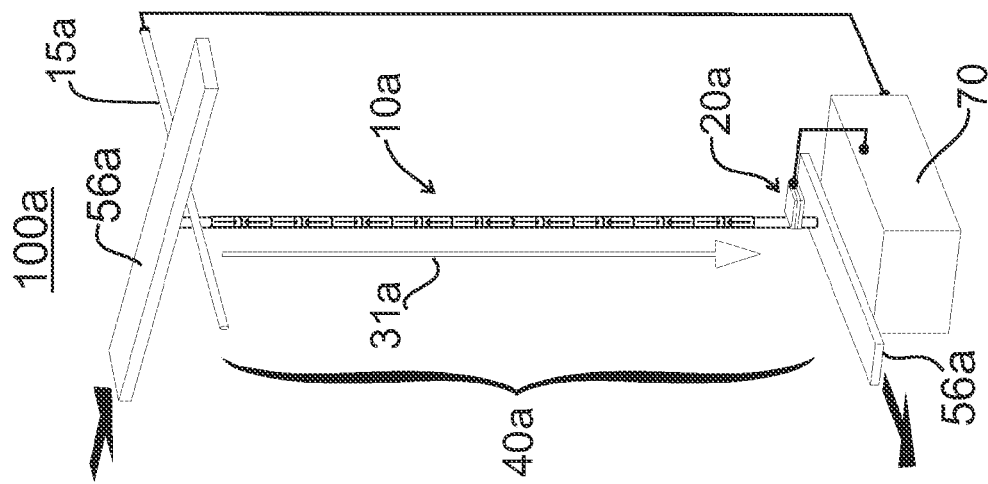
FIGS. 2A, 2B, and 2C, illustrates a preferred embodiment of the present invention.
Figure 2B:
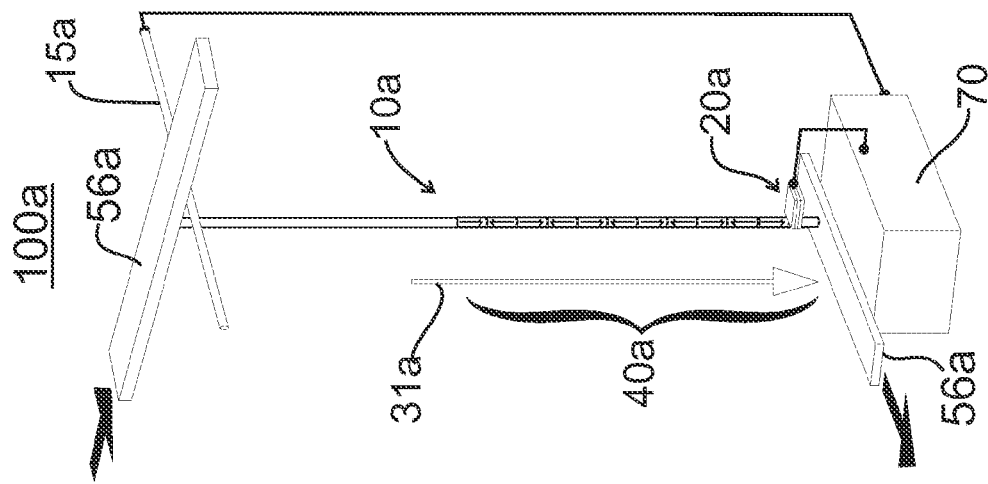
Figure 2C:
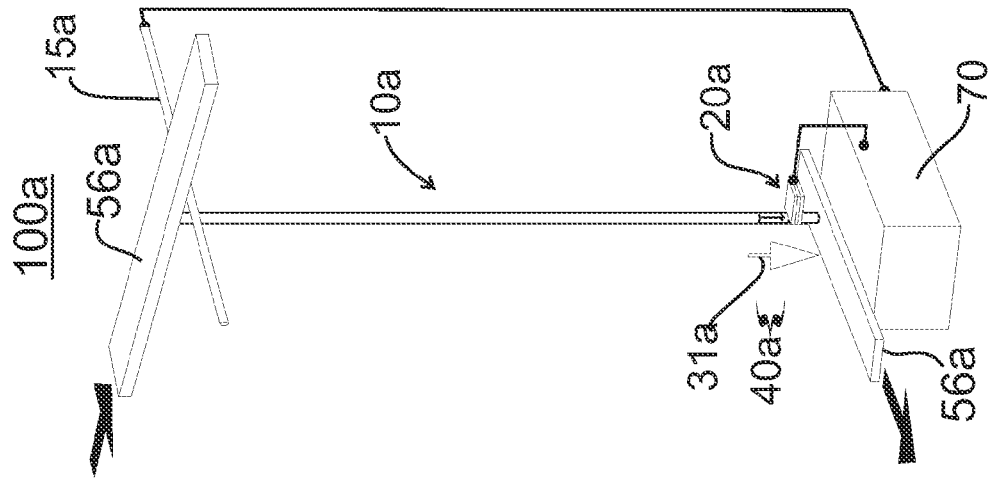

FIGS. 2A, 2B and 2C show a preferred embodiment of the present invention directed to a magnetic shift register 10a. In FIG. 2A there is no longer a reservoir for storing the shifted magnetic domain walls. Rather, the magnetic nanowire or racetrack comprises a storage region 40a in which a series of domains and their associated magnetic domain walls reside. The storage region 40a may be as long as the nanowire itself, or it can be shorter than the length of the nanowire to allow, for example, greater ease of fabrication of the nanowire or for the incorporation of electrical contacts and/or one or more reading elements 20a and writing elements 15a.

Pulses of current are used to move the series of domain walls within the region 40a along the nanowire in a single direction, indicated by the arrow 31a. The direction of this arrow represents the direction in which the domain walls move under the influence of a current or current pulse applied to the nanowire via electrical contacts 56a at either end of the nanowire. These contacts can be anywhere along the nanowire, at either end of the nanowire, or even outside of the storage region 40a.

A series of magnetic domains are shown schematically in FIG. 2A with the magnetization direction in each domain pointing in a direction along the nanowire's length. Note, however, that the magnetization within each domain can point in any direction, e.g., the magnetization can be perpendicular to the length of the nanowire or can be arranged at some arbitrary direction with respect to the length of the nanowire. Also note that the magnetization distribution within each domain may not be completely aligned along a particular direction but may have some variation in direction away from a single direction.

FIG. 2B illustrates the position of the series of domain walls in region 40a after one or more current pulses have been applied to the nanowire to move the domains along the nanowire. As can be seen from FIG. 2B, the number of domains has been reduced after this process because some of the domains have been shifted out of the length of the nanowire. Finally, in FIG. 2C essentially all the domains have been shifted out of the nanowire and are no longer stored in the nanowire. Rather, as shown by the schematic device labeled 70, these domains have been temporarily stored in a memory device built within the underlying microelectronic circuit device that supports the reading, writing and shifting functions of the racetrack memory device 100a. Note that the domains or domain walls can be written into the racetrack using the writing device 15a and read using the device 20a as described in U.S. Pat. No. 6,834,005 titled "Shiftable magnetic register and method of using the same" issued Dec. 21, 2004 to Parkin, which is hereby incorporated by reference. The memory device 70 and the electrical contact 56a may be separated by a gap (e.g. air), as shown in FIG. 2, or they may be separated by an insulating layer. The domains are "annihilated" simply by pushing them, with current pulses, beyond the reading device 20a, and eventually they will be pushed by these current pulses out of the end of the magnetic nanowire. Once the domains or domain walls are pushed beyond the reading element they can no longer be accessed and so are effectively eliminated from the racetrack. The end of the nanowire can be designed to ensure that the domain walls will be physically eliminated at or towards the end of the nanowire, e.g., by shaping the nanowire to a tapered point or to a rounded or elliptical form.

Although FIGS. 2A, 2B and 2C show a series of domain walls that are stored in the device 70, it may be advantageous to store a few or only a single domain or domain wall element in the device 70. The fewer the number of domains or domain wall elements there are in device 100a, the more compact this racetrack memory device can be, but at a higher cost. In one embodiment of the present invention, the series of domains/domain walls in storage region 40a is shifted incrementally by one unit along the nanowire in the direction 31a, so that one domain or domain wall is read at a time by the reading element 20a. This domain or domain wall is then shifted out of the nanowire but its state is recorded in the memory device 70. Then in the next operation, the state of this element, which was eliminated from the nanowire, is written back into the top of the nanowire using the writing element 15a.

While directional terms (such as up or down) are used herein, these terms are not intended to limit the implementation of the present invention to these directions. Similarly, the expressions top and bottom simply refer to opposite ends of the racetrack. Also, while the racetrack is shown as having a circular cross-section in FIGS. 2A, 2B and 2C, the shape of this nanowire can be circular, elliptical, square, rectangular or any other shape that i) makes it possible to reliably move the domain walls while ii) providing satisfactory thermal stability of the domain walls. To this end, it is advantageous to use a series of "pinning sites" along the racetrack, i.e., preferred positions for the domain walls along the track where the energy of the domain wall is decreased. These "pinning sites" can play an important role in defining energetically stable positions for the domain walls and thereby the spacing between consecutive bits. They are described in more detail in Applicant's co-pending application Ser. No. 12/197,155 titled "Magnetic racetrack with current-controlled motion of domain walls within an undulating energy landscape" filed Aug. 22, 2008, which is hereby incorporated by reference.

The memory device 70 may advantageously include any one of a number of memory storage components, such as volatile and non-volatile elements. For example, this memory device may comprise one or a combination of SRAM, DRAM, FRAM, MRAM, PCRAM, RRAM, phase-change, volatile silicon, and other CMOS memory components. The memory device may be selected based on, for example, compatibility of the memory device with the fabrication of the racetrack memory device's speed, performance, endurance, size and cost.

As indicated schematically by the electrical lead lines in FIG. 2, after a sensing circuit in the reading element 20a detects a signal corresponding to a magnetic domain in the magnetic shift register 10a, the piece of information represented by that signal is written into the memory device 70. That information can then be written back into the magnetic shift register 20a by the writing element 15a. This process can be repeated for other magnetic domains in the shift register 10a.

The memory device 70 may also include, or interface with, one or more circuits that perform calculations using the information that is written into the device 70. The result of these calculations may be output to other devices, or alternatively, may be written back into the shift register 20a by the writing element 15a.

The device 100a may be fabricated using convention lithographic processes, e.g., by first forming the memory device 70. The lower electrical contact 56a (e.g., made from metal) can then be formed over the memory device 70. The writing element 20a, the magnetic nanowire or racetrack of the register 10a that contains the magnetic domains, the writing element 15a, and the upper electrical contact 56a may then be formed in turn.

An advantage of certain embodiments of the present invention is that the domains and domain walls are only shifted in a single direction along the racetrack, thereby simplifying the design, fabrication and operation of the racetrack, as well as making the racetrack shorter for the same number of stored bits and therefore both operationally faster and easier to manufacture. Since the domain walls are only moved in one direction, it may be advantageous to shape the racetrack to allow for improved current induced motion of the domains/domain walls along the racetrack. This is illustrated by some exemplary devices shown in FIG. 3.

Figures 3A, 3B:
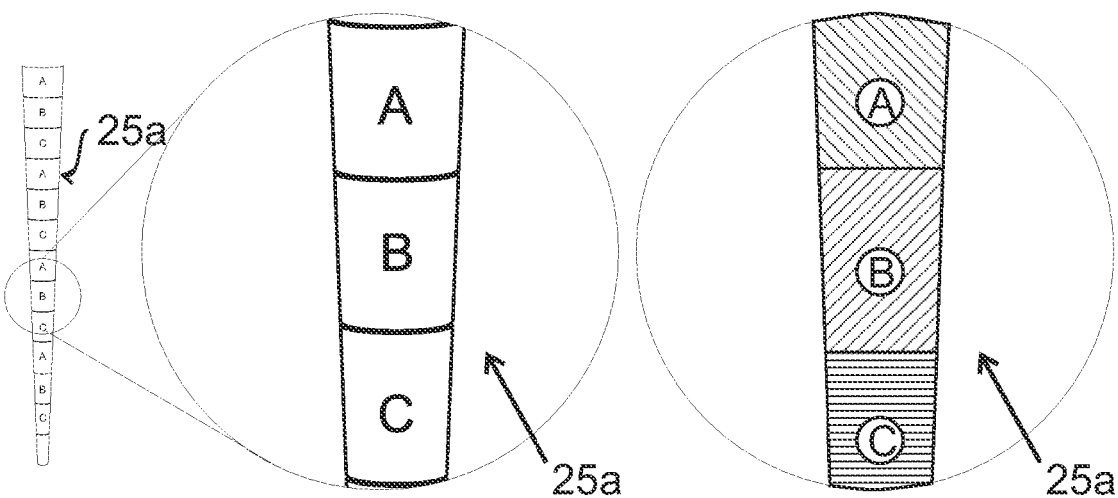
FIGS. 3A, 3B, 3C, 3D, 3E, and 3F illustrates how the magnetic nanowire of a racetrack device may be contoured to promote the movement of magnetic domains in only one direction.

FIG. 3A and its companion, magnified illustration FIG. 3B show a racetrack 25a whose cross sectional area monotonically decreases along the racetrack. Thus, successive elements A, B, C have systematically smaller cross-sectional areas. Since a domain wall typically prefers to have the smallest cross-sectional area, the structure of the racetrack will favor motion of the domain walls in one direction, making for more reliable and reproducible motion.

Figures 3C, 3D:
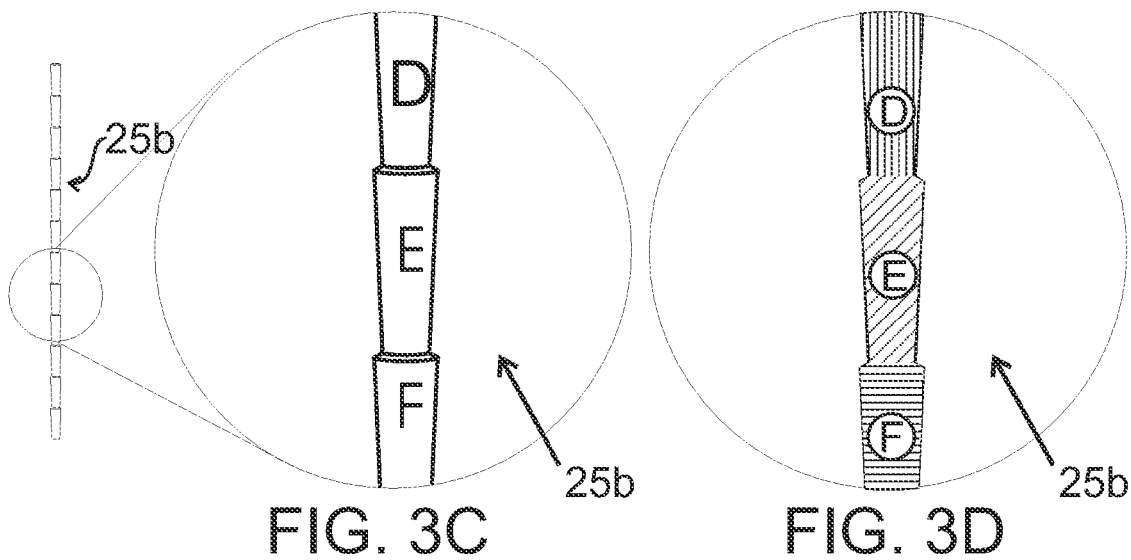

FIG. 3C and its companion, magnified illustration FIG. 3D show a racetrack 25b with segments D, E, and F, in which the cross-sectional area shrinks monotonically throughout one element but then increases from the end of one element to the beginning of the next element. This prevents the domain wall from moving readily between elements unless a sufficiently large shift current is used. This structure thus stabilizes domain walls against spurious fluctuations, e.g., thermal fluctuations.

Figures 3E, 3F:
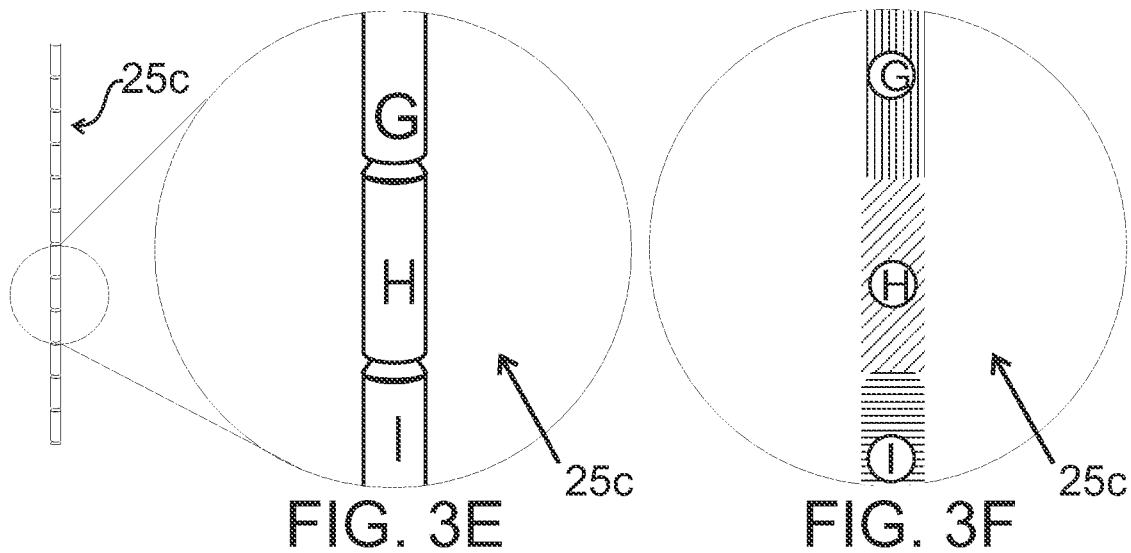

FIG. 3E and its companion, magnified illustration FIG. 3F show a racetrack 25c in which there is a reduction in area between each pair of successive segments (designated as G, H, I), in the form of a notch. The notch is contoured to allow domain walls to propagate easily in one direction but not easily in the opposite direction. This allows for improved reliability of operation of the racetrack memory device.

Figure 4A:
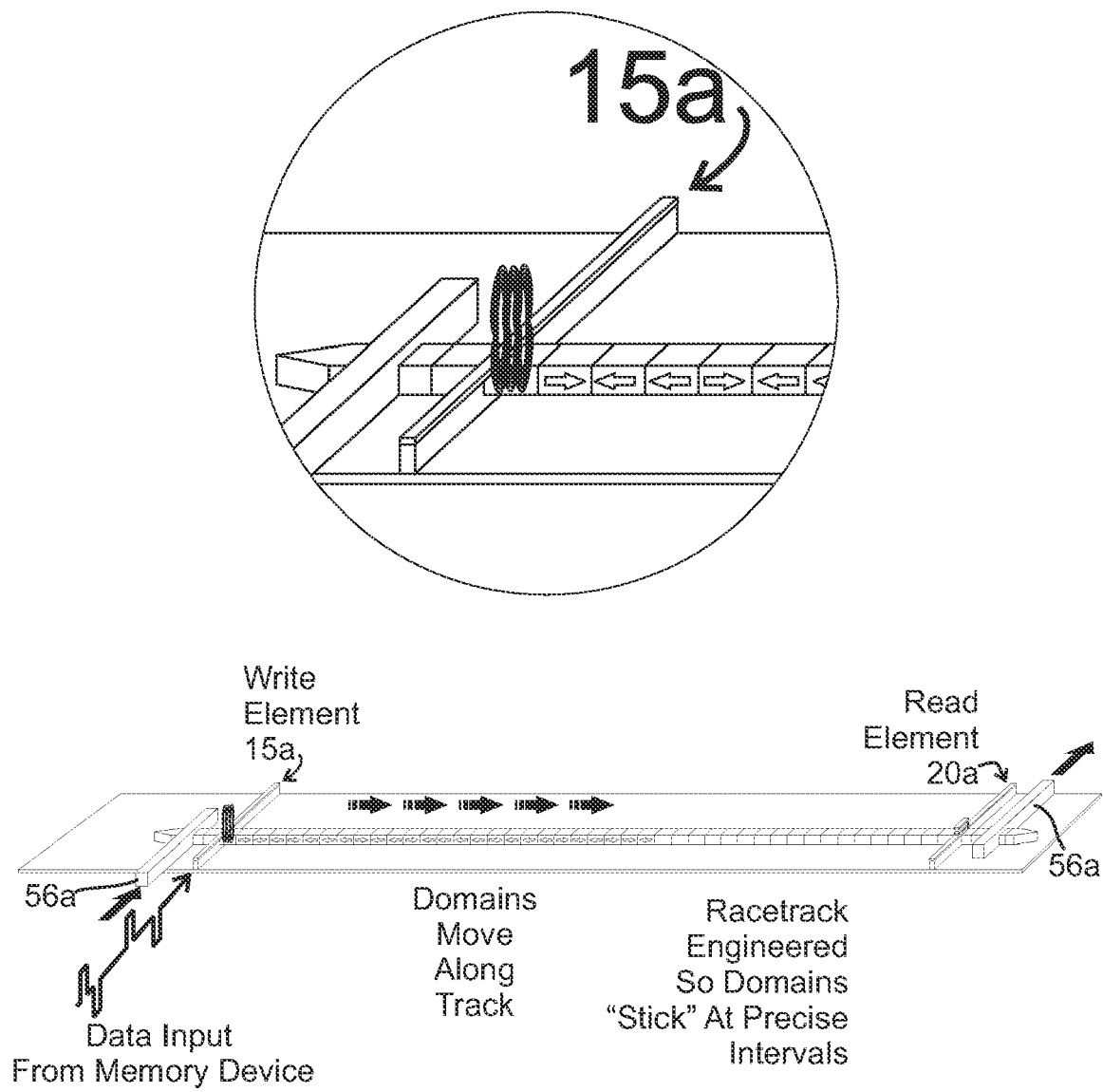
FIGS. 4A and 4B, illustrates a racetrack device in which the magnetic nanowire is oriented horizontally.
Figure 4B:
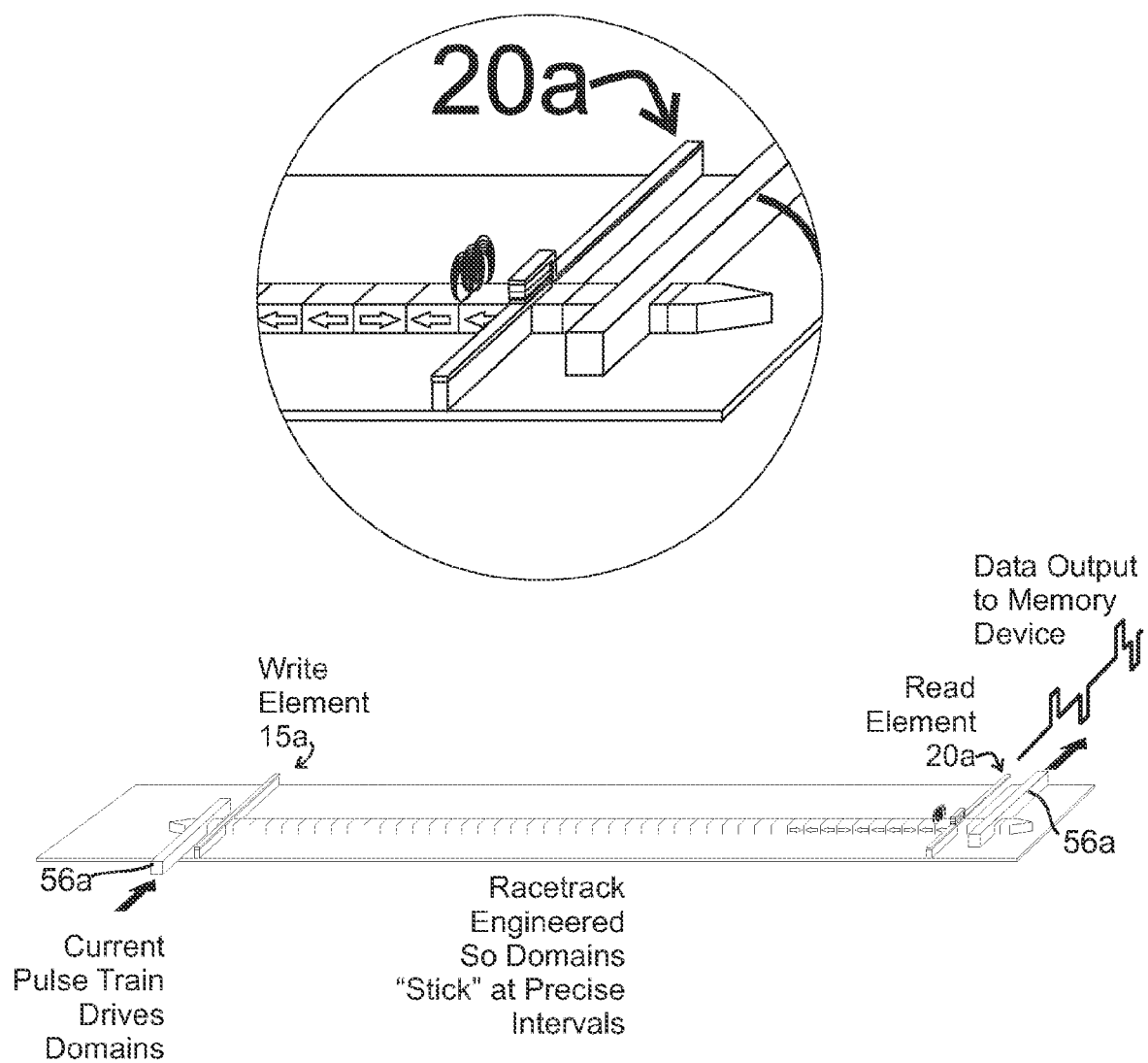

FIGS. 4A and 4B show an implementation of a racetrack memory device having a racetrack oriented in the horizontal direction, but in which the domain walls are only moved in one direction, as discussed above with respect to the "vertical" racetrack configuration shown in FIG. 2, for example. These figures also indicate how data may be read into the magnetic racetrack from the memory device (FIG. 4A) and out of the magnetic racetrack into the memory device (FIG. 4B).

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

In preferred embodiments of the invention, there is provided media encoded with executable program code to effect any of the methods described herein. This code contains executable instructions that may reside, for example, in the random access memory (RAM) of a processor, or on a hard drive or optical drive of a processor. The instructions may be stored on a magnetic or optical disk or diskette, a disk drive, magnetic tape, electronic read-only memory, or other appropriate data storage device. In preferred embodiments, this program code may be read by a digital processing apparatus such as a processor or computer for performing any one or more of the methods disclosed herein.

The invention claimed is:

1. A device, comprising:
    a track that includes magnetic material, wherein the track is designed to contain magnetic regions that can be shifted along the track in response to electric current passing through the track, the magnetic regions including respective domain walls;
    a read component for reading out data represented by respective magnetic regions in the track, wherein the domain walls of said respective magnetic regions are annihilated upon reading out the data represented by said respective magnetic regions; and
    a write component for writing data into magnetic regions in the track after corresponding data are read out by the read component, the device thereby functioning as a shift register.

2. The device of claim 1, further comprising at least one electrical component in electrical communication with the track, wherein the electrical component can be connected to a source of electric current that moves magnetic regions through the track.

3. The device of claim 1, wherein the read component is located at one end of the track, and the write component is located at another end of the track.

4. The device of claim 1, wherein the data represented by said respective magnetic regions are written into a memory device, before being written back into magnetic regions by the write component.

5. The device of claim 4, wherein the memory device is a CMOS device.

6. The device of claim 1, wherein the respective magnetic regions can only be moved in one direction through the track.

7. A method, comprising:
    applying a current pulse to the track of the device of claim 1, so that a given magnetic region is moved from one pinning site in the track to another pinning site in the track.

8. The method of claim 7, comprising reading information into a memory device, the information corresponding to the data represented by said respective magnetic regions.

9. The method of claim 8, wherein the memory device is a CMOS device.

10. The method of claim 8, further comprising:
    performing calculations with the information stored in the memory device, thereby forming different information.

11. The method of claim 10, wherein the different information is written into magnetic regions in the track by the write component.

12. The method of claim 8, wherein data represented by said respective magnetic regions are written into the memory device, and thereafter are written back into magnetic regions in the track by the write component.

13. The method of claim 8, wherein the respective magnetic regions can only be moved in one direction through the track.

14. A device, comprising:
    a track that includes magnetic material, wherein the track contains magnetic regions that represent data, the magnetic regions including respective domain walls, wherein electric current applied to the track shifts magnetic regions in only one direction along the track;
    a read component for reading out data represented by respective magnetic regions in the track, wherein the domain walls of said respective magnetic regions are annihilated upon reading out the data represented by said respective magnetic regions; and
    a write component for writing data into magnetic regions in the track after corresponding data are read out by the read component, the device thereby functioning as a shift register.

15. The device of claim 14, wherein the track has a cross sectional area that decreases monotonically along the track.

16. The device of claim 14, wherein the track includes segments that are contoured so that the magnetic regions only move in one direction through the track.

17. The device of claim 16, the cross sectional area of the track decreasing from one end of a given segment to an opposite end of said given segment, but increasing from said opposite end of said given segment to a segment adjacent to said given segment.

18. The device of claim 16, in which adjacent segments are separated by respective notches, each notch having a cross sectional area that is less than the cross sectional area of any segment adjacent to the notch.

* * * * *

UNITED STATES PATENT AND TRADEMARK OFFICE
CERTIFICATE OF CORRECTION

PATENT NO.         : 7,551,469 B1                                         Page 1 of 1
APPLICATION NO.    : 12/348779
DATED              : June 23, 2009
INVENTOR(S)        : Stuart Stephen Papworth Parkin It is certified that error appears in the above-identified patent and that said Letters Patent is hereby corrected as shown below:

On the title page item 73 should read:

(73) International Business Machines Corporation, Armonk NY (US)

Signed and Sealed this

Twenty-eighth Day of July, 2009

JOHN DOLL
*Acting Director of the United States Patent and Trademark Office*